(12) United States Patent
Ten Pierick

(10) Patent No.: US 6,226,344 B1
(45) Date of Patent: *May 1, 2001

(54) GENERATION OF A TIME PERIOD

(75) Inventor: Hendrik Ten Pierick, Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,944

(22) Filed: Jun. 23, 1998

(30) Foreign Application Priority Data

Jun. 27, 1997 (NL) .................................................. 97201970

(51) Int. Cl.$^7$ .................................................. H03K 21/00
(52) U.S. Cl. .............................. 377/20; 377/27; 327/241; 327/252; 327/344
(58) Field of Search .................................. 377/20, 1, 27; 327/237, 241, 252, 336, 344

(56) References Cited

U.S. PATENT DOCUMENTS

| 4,809,068 | 2/1989 | Nagai | 358/148 |
| 4,908,784 | * 3/1990 | Box et al. | 377/20 |
| 5,233,232 | 8/1993 | Stuebing et al. | 307/234 |
| 5,235,422 | 8/1993 | Ido et al. | 358/158 |
| 5,333,162 | * 7/1994 | Condreva | 377/20 |
| 5,363,419 | 11/1994 | Ho | 375/120 |
| 5,638,418 | * 6/1997 | Douglass et al. | 377/25 |
| 5,801,560 | * 9/1998 | McDonald et al. | 327/134 |

FOREIGN PATENT DOCUMENTS

3403637A1   8/1985  (DE) .

* cited by examiner

Primary Examiner—Margaret R. Wambach
(74) Attorney, Agent, or Firm—Bernard Franzblau

(57) ABSTRACT

A time period (Td) is generated with a high accuracy and a high resolution. At a starting instant (ti) of the time period (Td), an analog integration operation (3) is started to generate an integration value (ios). At a certain instant (t1), the analog integration operation is interrupted to start counting (2) clock pulses (Clk). A selected number (N;N2) of clock pulses (Clk) is counted to obtain a sub-period (T2). The analog integration operation is resumed at the end of the sub-period (T2) at the integration value (ios) reached at the start of the sub-period (T2). The analog integration operation finishes at an end instant (td) of the time period (Td) at which the integration value (ios) crosses a reference value (Ref).

5 Claims, 8 Drawing Sheets

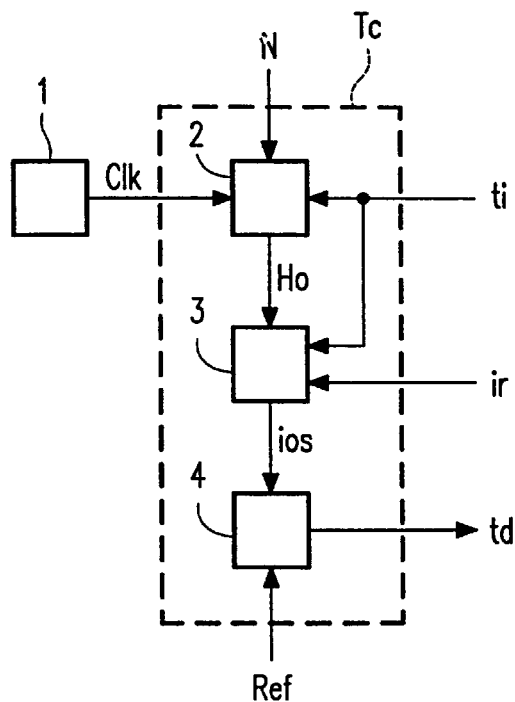
FIG. 1
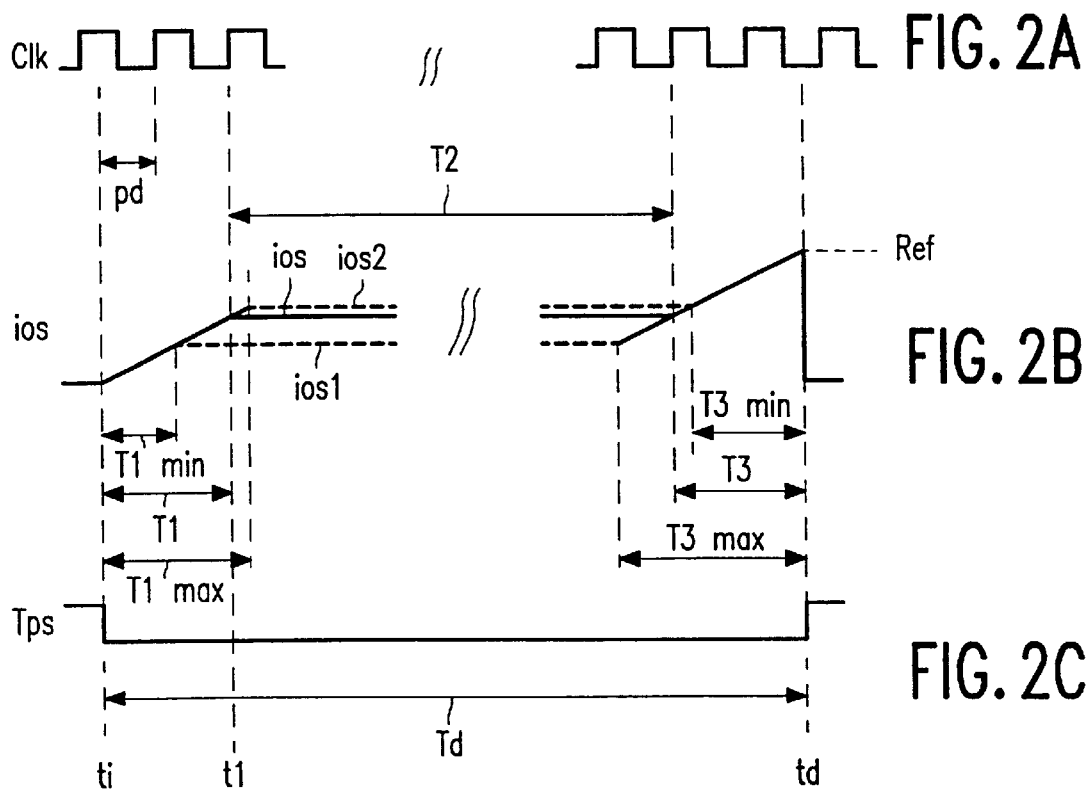
FIG. 2A
FIG. 2B
FIG. 2C

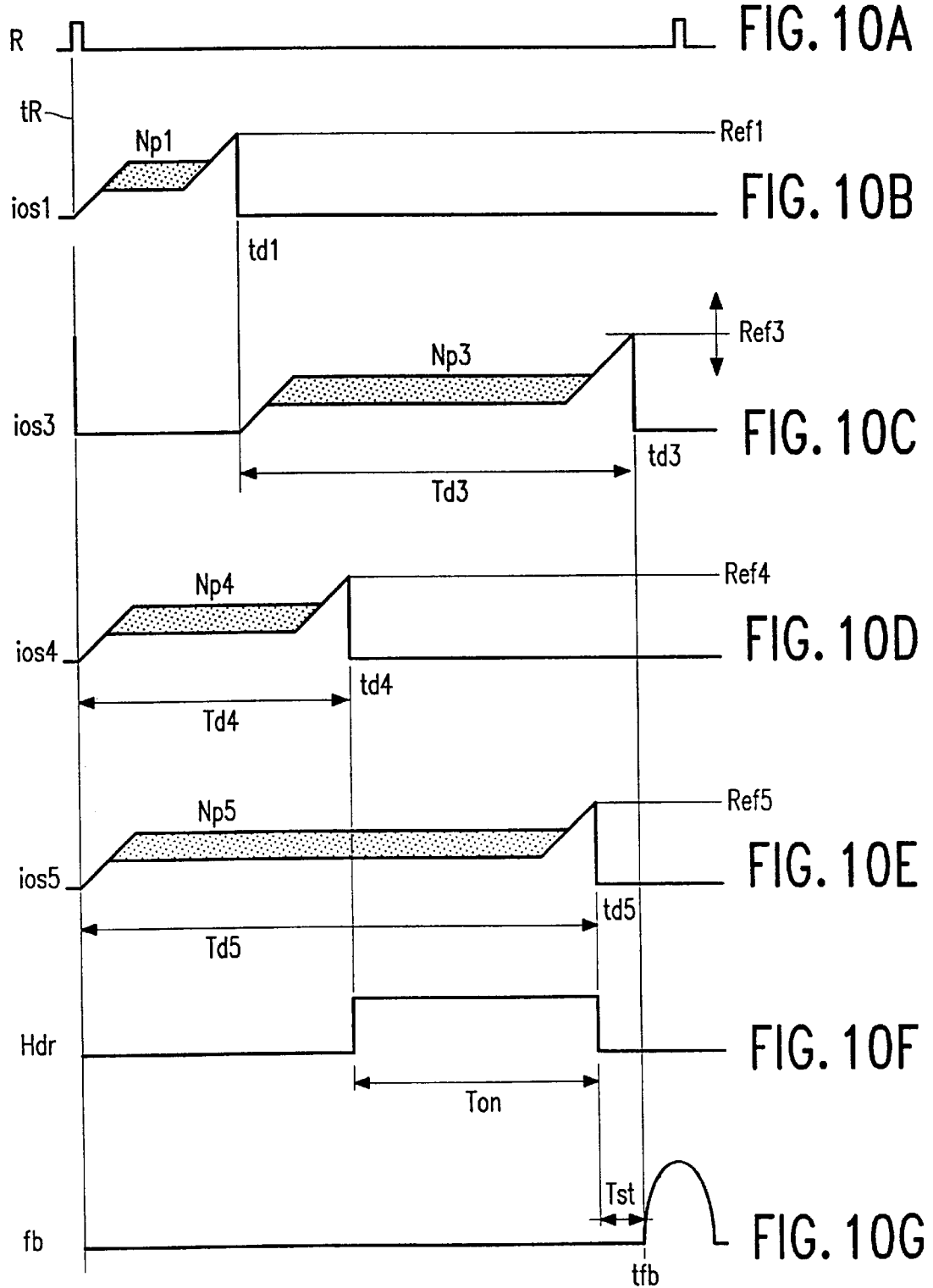

GENERATION OF A TIME PERIOD

Background of the Invention

This invention relates to a method of generating a time period as defined in the precharacterizing part of claim 1.

The invention further relates to a circuit for generating a time period.

Such a time period generation is especially suitable for use in a vertical or horizontal synchronizing circuit or in a control circuit for a switched mode power supply.

U.S. Pat. No. 5,233,232 discloses a timer circuit which provides a wide range of precise and substantially accurate time intervals. The timer circuit includes a ramp generator circuit which starts a ramp signal in response to a start signal, a comparator which compares the ramp signal with a reference voltage source for providing an end of ramp signal indicating an end of the ramp, a counter which counts a predetermined number of clock pulses starting from the end of the ramp to provide a count signal, and an AND gate which combines the end of ramp signal and the count signal to provide a signal that is delayed with respect to the start signal by a predetermined amount. U.S. Pat. No. 5,233,232 further discloses that short time intervals are generated by the ramp generator circuit only, and long time intervals are generated by performing a digital counting operation after the end of the ramp. A fixed ramp interval is generated. Consequently, the resolution of long time intervals is determined by the clock period of the clock pulses. It is further disclosed that it is possible to also adjust the ramp interval for combined ramp and counter time intervals. It is not disclosed how this should be done. It is stated that an extremely fine resolution is rarely required, or even desirable, when a long time interval is selected. Even if the ramp interval is adjusted, the resolution of the long time interval is determined by the clock period of the clock pulses, unless the clock pulse generator starts within a very accurate time with a very accurate phase after the end of the ramp. Such an accurate start stop oscillator is extremely complex.

SUMMARY OF THE INVENTION

It is an object of the invention to provide a simple method of generating a time period with a very high accuracy and with an analog resolution.

To this end, a first aspect of the invention provides a method of generating a time period as defined in claim 1. A starting instant starts an analog integration operation to generate an integration value. At a certain instant, the analog integration operation is interrupted to start counting clock pulses. A selected number of clock pulses is counted to obtain a sub-time period. The analog integration operation is resumed at the end of the sub-time period at the integration value reached at the start of the sub-time period. The analog integration operation finishes at the instant the integration value crosses a reference value. So, three successive sub-time periods occur. A first sub-time period of integrating starts at the start instant and lasts until the counting starts, a second sub-time period during which the counter counts clock pulses, and a third sub-time period starts at the instant the counter has counted the selected number of clock pulses and lasts until the integration value has reached the reference value. The time period starts at the start of the first sub-time period and ends at the end of the third sub-time period. The accuracy of the generated time period is very high. The counting of clock pulses starts and ends at an instant related to the clock pulses. The frequency and phase of the clock pulses is completely irrelevant to the accuracy reached, as the integration operation is frozen at the very instant the counting starts and is resumed the instant the counting finishes. It is not required to start an oscillator in a very well-defined way the instant the integration operation has reached a reference level. The method according to the invention interrupts the integration operation the instant the counting starts. In practice, the accuracy is determined only by noise on the analog integration-operation step and by noise on the step of determining when the integration value crosses the reference level. These noise sources cause jitter in the duration of the generated time period. The time period is generated with a very high analog resolution by adapting the reference value or the steepness of the analog integration operation.

It is known to generate a time period or delay with either analog or digital techniques.

The accuracy of a delay generated with digital techniques is limited due to the quantized time steps of clock pulses. Impractically high clock frequencies are required if a very accurate delay is required in the order of one nano-second.

The accuracy of a delay generated with analog techniques is limited due to the signal-to-noise ratio. Analog delay may be obtained by generating an analog sawtooth by charging a capacitor with a current. The analog sawtooth is started from a starting level at the start instant. A comparator compares the sawtooth with a reference voltage. When the sawtooth crosses this reference voltage, the sawtooth is terminated. The delay runs from the start instant until the instant the sawtooth is terminated. The invention is based on the insight that there are at least three noise sources. The first noise source is charge noise in the sawtooth capacitor. When current flows for a certain time, a charge is moved. The moved charge has an error which is Poison distributed. This error is proportional to the square root of the number of moved electrons. This error is called charge noise. The charge as well as the charge noise are converted to a voltage by a capacitor. Increasing the moved charge will increase the charge noise by the square root of this moved charge. The signal-to-noise ratio, however, will increase with the square root of the moved charge. So, a large moved charge is important for a good signal to noise ratio. The ratio between the intended sawtooth and the noise can be increased by increasing the sawtooth capacitor or the reference voltage, or both. In integrated circuits, a large capacitor or a large reference voltage is unpractical. The second noise source is the voltage noise on the reference voltage. This voltage noise can be reduced by a design exhibiting a low noise density, sometimes at the expense of dissipation. The third noise source is the voltage noise of the comparator. The comparator noise can be reduced by reducing the comparator noise density and the comparator noise bandwidth. All three noise sources are added together and have a certain frequency spectrum. The comparator filters this noise spectrum with the comparator bandwidth. In order to obtain a low noise level, reduction of the comparator bandwidth to the lowest acceptable value is very important. A small bandwidth will give a longer comparator delay, but that can be compensated for. The total noise detected by the comparator is converted to timing noise by the slew rate of the sawtooth. This results in jitter on the delay. In order to obtain the lowest jitter with a given noise, the slew rate of the signal to be compared with the reference voltage should be as high as possible. For long delays it is impossible to reach a high slew rate as the maximum voltage swing of the sawtooth is limited by the maximum voltage ratings of the integrated circuit. Consequently, a long delay generated in an analog way causes substantial jitter because of the low slew rate.

The invention generates a sawtooth voltage with a high slew rate because the duration of the sawtooth is short. Consequently, the jitter is very small and the accuracy very high. The length of the delay is freely selectable with a resolution of one clock period by changing the predetermined number, and with an analog resolution by changing the reference level or a slope of the sawtooth voltage.

Advantageous embodiments are defined in the dependent claims.

An embodiment of the invention as claimed in claim 2 has the advantage that an accurate duration of the first sub period is obtained. It is guaranteed that the analog integration operation has been started before it will be interrupted. Further, it is possible to start the interruption of the analog integration operation as soon as possible, for example after a first sub-period of one clock pulse. Consequently, the third sub-period has a maximum duration, thereby enabling a maximum control range.

In an embodiment of the invention as claimed in claim 3, the clock pulses are generated with a very high accuracy, for example by using a crystal. Although the duration of the second sub-period is selectable in fixed steps only, this duration is very accurate.

In an embodiment of the invention as claimed in claim 5, tolerances in the sawtooth voltage due to temperature drift, process spreads, and aging are compensated.

A second aspect of the invention provides a circuit for generating a time period as defined in claim 6.

These and other aspects of the invention will be apparent from and elucidated with reference to the accompanying drawings.

BRIEF DESCRIPTION OF THE DRAWINGS

In the drawings:

FIG. 1 shows a basic circuit diagram of an embodiment of a circuit for generating a time period according to the invention, FIGS. 2A, 2B and 2C show waveforms for explaining the operation of the circuit diagram of FIG. 1, FIGS. 10A to 10G show waveforms for explaining the operation of the circuit diagram of FIG. 9.

DESCRIPTION OF THE PREFERRED EMBODIMENTS

Figure 3:
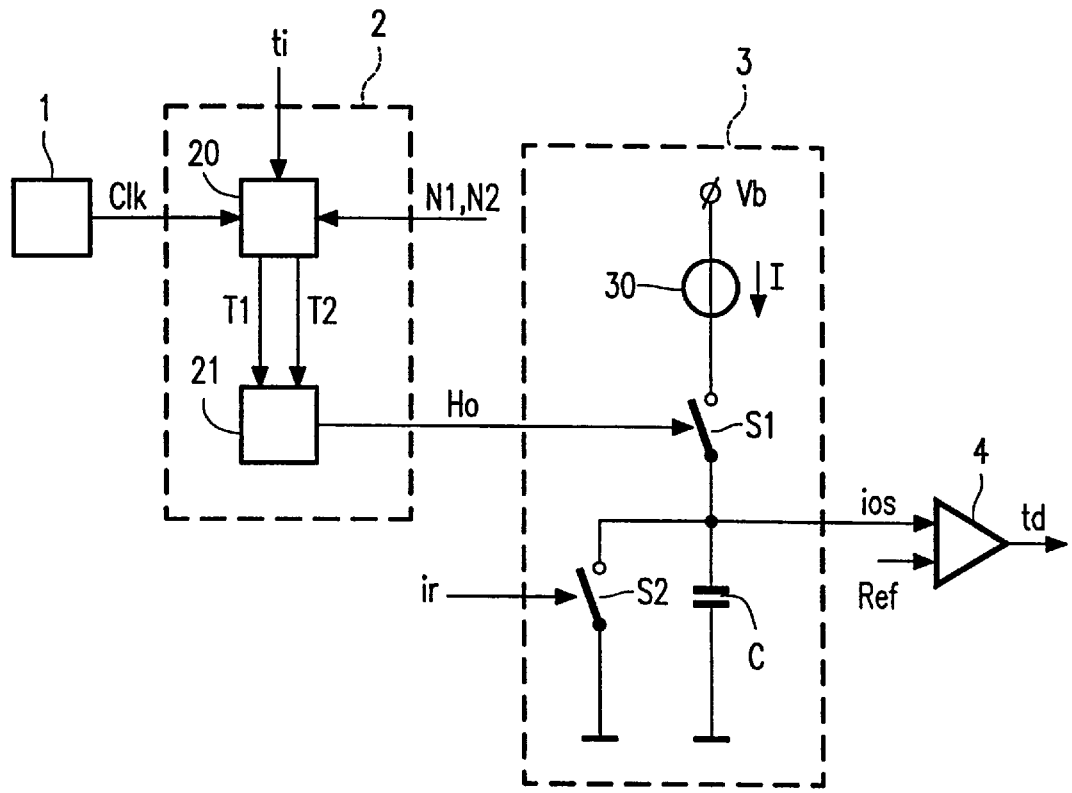
FIG. 3 shows a more detailed circuit diagram of an embodiment of a circuit for generating a time period according to the invention.

FIG. 1 shows a basic circuit diagram of an embodiment of a time period generating circuit Tc for generating an accurate time period Td according to the invention. An oscillator 1 supplies clock pulses Clk to a counter circuit 2. The counter circuit 2 receives a start instant ti and a predetermined number N, and supplies a hold signal Ho to an analog integrator 3. The analog integrator 3 receives the start instant ti and an integrator reset signal ir, and supplies an integrator output signal ios to a comparator 4. The comparator 4 receives a reference level Ref and supplies a time period instant td which is the start instant ti delayed the accurate time period Td. The duration of the accurate time period Td is selectable with an analog precision.

FIGS. 2A, 2B, and 2C show waveforms for explaining the operation of the time period generating circuit Tc of FIG. 1. FIG. 2A shows the clock pulses Clk. The clock pulses Clk may be generated in several known ways. In a first way, a crystal oscillator generates the clock pulses Clk with a accurate fixed repetition frequency, and with a phase which is not locked to the start instant ti. If the start instant ti occurs repetitively, the clock pulses Clk may be generated with a phase locked loop (PLL) to obtain clock pulses Clk which have a repetition frequency equal to a repetition frequency of the start instant ti, and which are phase locked to the start instants ti. An example of repetitive start instants ti are synchronisation pulses S. FIG. 2B shows several integrator output signals ios, ios1, and ios2 which each show the interrupted analog integration operation as an interrupted rising sawtooth voltage. The integrator output signal ios is also referred to as sawtooth voltage ios. FIG. 2C shows a time period signal Tps of which the falling edge represents the start instant ti, the low level represents the time period Td, and the rising edge represents the time period instant td.

The operation of the time period generating circuit Tc is explained with respect to clock pulses Clk having a phase difference pd with respect to the start instant ti. Only the non-broken lines, referred to as ios, correspond to clock pulses Clk with the phase difference pd as shown in FIG. 2A.

The counter 2 starts counting a first predetermined number N1 of clock pulses Clk from the start instant ti to obtain a first sub-time period Ti. The predetermined number N1 is selected to be two. This causes the first sub-time period T1 to end at the second rising clock edge after the start instant ti. The analog integrator 3 is active during the first sub-period T1 and generates the sawtooth voltage ios starting at a starting value. At the end instant t1 of the first sub-period T1 the analog integrator 3 is hold by an active held signal Ho, and the sawtooth voltage ios is frozen at the value reached. The counter 2 starts counting a second predetermined number N of clock pulses Clk to obtain a second sub-period T2. After the N clock pulses Clk, the hold signal Ho becomes inactive and the analog integrator 3 becomes active again. The sawtooth voltage ios starts rising from the hold value reached at the end of the first sub-period T1. The time period signal Tps changes to a high level at the time period instant td when the sawtooth voltage ios crosses the reference level Ref.

The sawtooth voltage ios is reset to its starting value by the integrator reset signal ir. The integrator reset signal ir may be the time period instant td. A third sub-period T3 is defined as the period running from the end of the second sub-period T2 until the instant the sawtooth voltage ios crosses the reference level Ref.

The time period Td, or the total delay of the start instant ti until the time period instant td is the sum of a first analog delay (T1), a digital delay (T2) and a second analog delay (T3), as shown in FIG. 2B. The time period Td is generated with analog resolution because the instant the sawtooth voltage ios crosses the reference value Ref is controlled very precisely by controlling the value of the reference value Ref. The accuracy of the time period Td is very high as the jitter is very low.

The total jitter in the time period Td is the sum of two jitters. The first jitter is the jitter caused by counting the N clock pulses. If a crystal clock and synchronous logic is used, the total jitter is independent of the counted delay T2. During the hold of the analog integrator 3, no charge is moved so no charge noise is built up. Thus, the analog jitter is caused by charge movement for generating the sawtooth voltage during the first and the third sub-periods T1, T3, and by comparator noise. This jitter is kept very small by selecting a high slew rate for the analog integration operation 3 and generating the rest of the time period Td by the digital counting of N clock pulses Clk.

A maximum analog control range of the duration of the time period Td is obtained when the third sub-period T3 is as long as possible, and thus the first sub-period T1 is as short as possible. In order to obtain a correct start up of the sawtooth voltage ios, the analog integrator 3 is active for at least one clock period Clk. The sawtooth voltage ios is held at the start of the second clock period Clk, after said sawtooth voltage ios started rising at the start instant ti. The sawtooth voltage ios is shown in two extreme situations of the phase difference pd between the start instant ti and the clock pulses Clk, and is indicated by broken lines ios1 and ios2. The sawtooth voltage ios1 shows the situation in which the rising edge of the first clock pulse Clk occurs immediately after the start instant ti. The sawtooth voltage ios2 shows the situation in which the rising edge of the first clock pulse Clk occurs nearly one clock period after the start instant ti. The actual duration of the first sub-period T1, T1min, T1max depends on the phase difference pd between the start instant ti and, in this case, rising edges of the clock pulses Clk.

In case of asynchronous clock pulses Clk, the duration of the first sub-period T1, T1min, T1max varies continuously between one and two clock pulses Clk. Due to the continuously varying duration of the first sub-period T1, T1min, T1max, the hold value of the sawtooth voltage ios varies as well. After the constant hold period, which is the second sub-period T2 determined by counting N clock pulses Clk, the sawtooth voltage ios further increases, starting at the hold value. The sawtooth voltage ios at the end of the second sub-period T2 is thus independent of the actual phase difference pd of the clock pulses Clk with respect to the start instant ti. In this way, the time period instant td at which the sawtooth voltage ios crosses the reference level Ref, and thus the total delay Td, does not depend on this phase difference pd. The first sub-period T1 has a duration which is dependent on the phase difference pd between the start instant ti and the clock pulses Clk. In the same way, the third sub-period has a duration T3, T3min, T3max which is dependent on this phase difference pd.

The time period Td, which is the total delay Td from the start instant ti, is set by the width of the second sub-period T2 in steps of one clock pulse Clk. The time period Td can be set continuously by adapting the duration of the third sub-period T3 by controlling the reference level Ref or the slope of the sawtooth voltage ios. The comparator 4 may have a small bandwidth for minimizing noise. The long delay which is inherent to the small bandwidth can be compensated for by the number N of counted clock pulses Clk during the second sub-period T2. The minimized noise is converted to a low jitter by the high slew rate of the sawtooth voltage ios.

FIG. 3 shows a more detailed circuit diagram of an embodiment of a circuit for generating a time period according to the invention. The analog integrator 3 comprises a series arrangement of a current source 30, a first switch Si and a capacitor C. The current source 30 receives at its free end a supply voltage Vb, and supplies a current I. The capacitor C has a free end connected to ground. A second switch S2 is arranged in parallel with the capacitor C, and is controlled by the integrator reset signal ir. The first switch S1 is controlled by the hold signal Ho supplied by the counter circuit 2. The counter circuit 2 comprises a counter 20 and a logic circuit 21. The counter 20 receives the clock pulses Clk from the oscillator 1, the start instant ti, and the predetermined numbers N1 and N2. At the start instant ti, the counter 20 starts counting N1 clock pulses Clk to determine the first sub time period T1. The second sub-time period in time is determined by counting N2 clock pulses Clk. The logic circuit receives an information T1, T2 about the first and the second sub-time periods T1, T2 and supplies the hold signal Ho to the first switch S1. Before the start of the first sub time period T1, the analog integrator 3 is reset by closing the second switch S2. At the start of the first sub time period T1, the second switch S2 is opened and the first switch S1 is closed. The capacitor C starts charging with the current I. A sawtooth voltage ios is generated on the capacitor C. During the second sub-time period T2, which starts at the end of the first sub-time period T1, both the first and the second switch S1, S2 are open. The sawtooth voltage ios will be constant. At the end of the second sub-time period T2, the first switch S1 is closed again, and the sawtooth voltage further increases. The comparator 4 receives the sawtooth voltage ios and the reference level Ref, and supplies a level indicating the time period instant td the moment the sawtooth voltage ios crosses the reference level Ref. The integrating reset ir may close the second switch S2 at the time period instant td.

Figure 4:
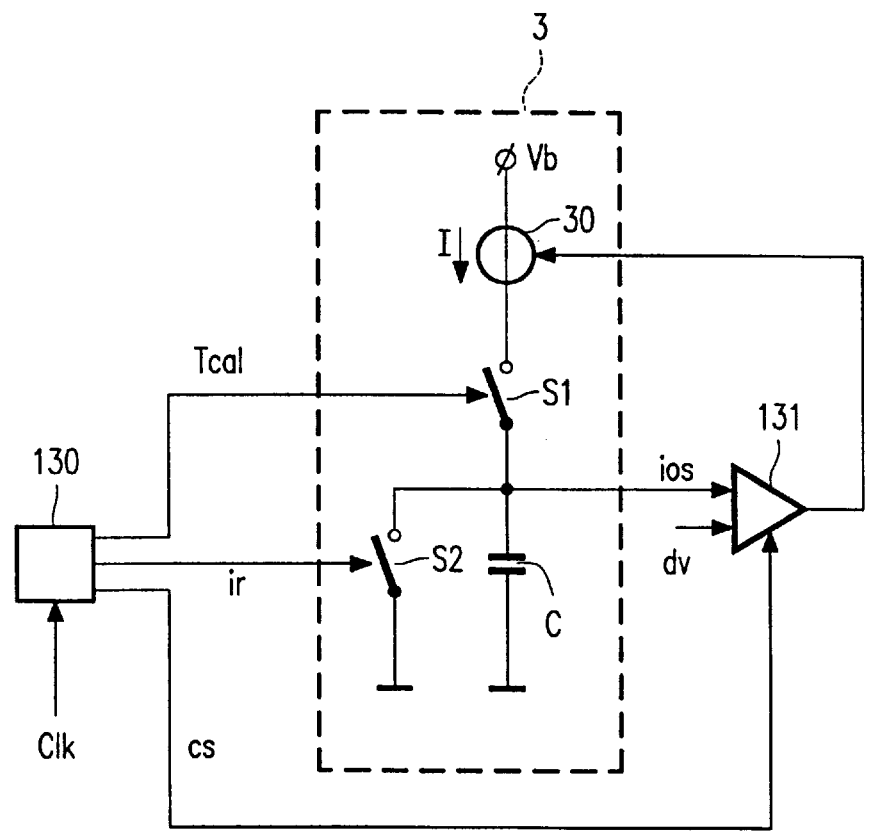
FIG. 4 shows a circuit diagram of a circuit for automatic calibration of a sawtooth voltage.

FIG. 4 shows a diagram of a circuit for automatic calibration of the sawtooth voltage ios. In order to obtain an analog integration operation circuit 3 which is process and temperature independent, the amplitude of the sawtooth voltage ios is calibrated with respect to the very accurate duration of a selected number (for example 4) of clock pulses Clk. FIG. 4 shows the analog integration operation circuit 3 as described with respect to FIG. 3.

The automatic calibration circuit comprises a timing signal generation circuit 130 and a control circuit 131. The timing signal generation circuit 130 receives the clock pulses Clk, and supplies a calibration period signal Tcal to the first switch S1, the integrator reset signal ir to the second switch S2, and a control signal cs to the control circuit 131. First, the integrating reset signal ir closes the second switch S2 to obtain a well-defined starting level for the sawtooth voltage ios. Then, the calibration period signal Tcal closes the first switch S1 during the selected number of clock pulses Clk. The sawtooth voltage ios increases from its starting level. The instant the first switch S1 is opened, the control signal cs commands the control circuit 131 to adapt the current I supplied by the current source 30 if the sawtooth voltage ios does not have a desired value dv at this instant. The slope of the sawtooth voltage ios i3 adjusted in such way that the instant the sawtooth voltage ios reaches the desired value dv coincidences with the end of the calibration period. Auto calibration also ensures maximum use of the dynamic range of the analog integration operation 3 at different clock pulse repetition frequencies.

Figure 5:
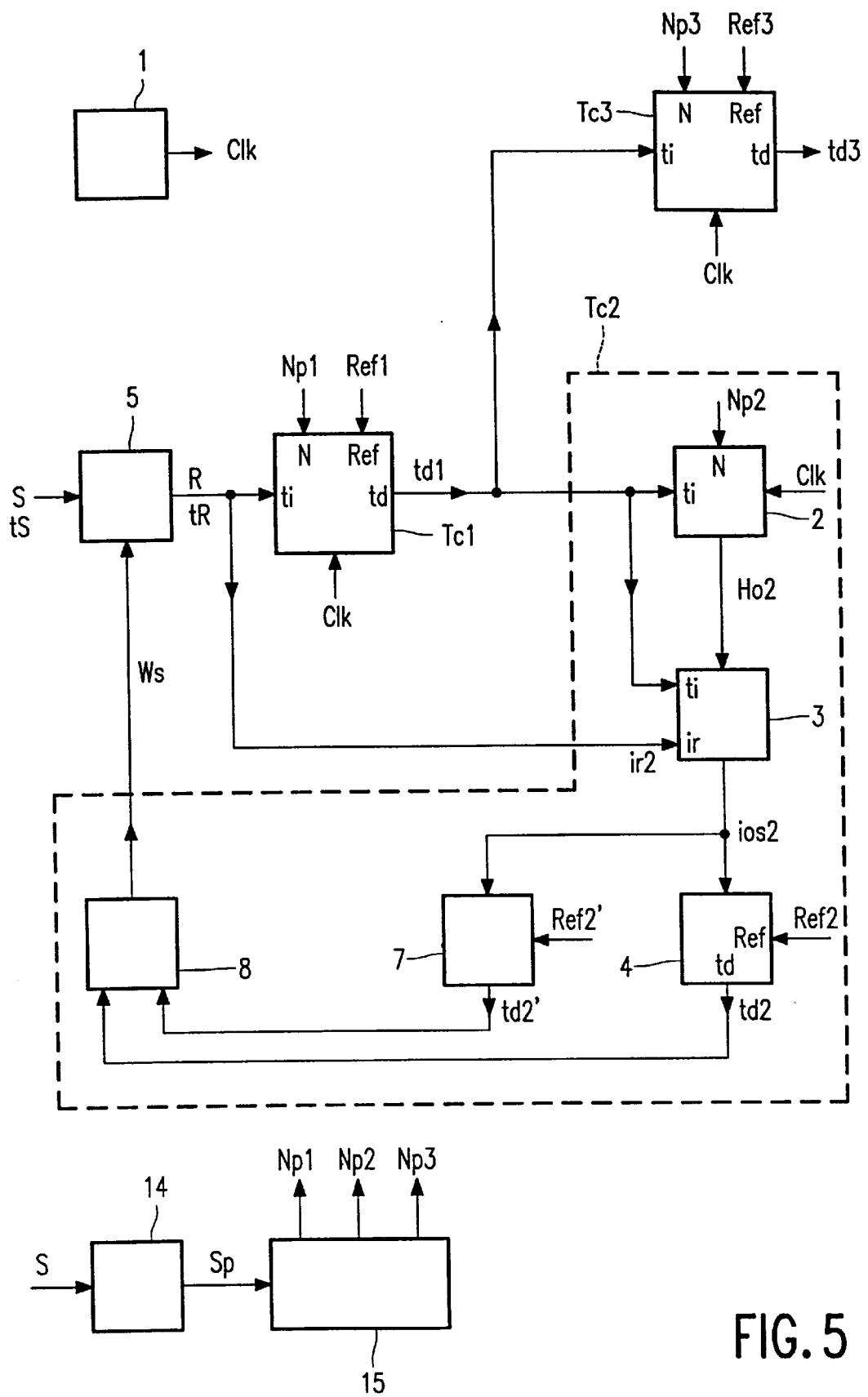
FIG. 5 shows a circuit diagram of an embodiment of a synchronizing circuit with a circuit for generating a time period according to the invention.

FIG. 5 shows a circuit diagram of a synchronizing circuit for synchronizing reference instants tR with synchronizing instants tS. The synchronizing circuit comprises time period generating circuits Tc1, Tc2 and Tc3, which are equivalent to the time period generating circuit Tc according to the invention. Instants represented by a signal are referred to by the same reference as the signal, yet preceded by a "t". An instant of a signal may be the leading edge, or the trailing edge, or the centre between the leading and trailing edge of a pulse of this signal.

A decision circuit 5 receives a synchronizing signal S determining the synchronizing instants tS, and a window signal Ws representing a time window W. The synchronizing signal S may comprise line or frame synchronizing pulses separated from a video signal, or supplied by a computer. The decision circuit 5 supplies a reference signal R determining the reference instants tR. The reference instant tR represents the synchronising instant tS if the synchronizing instant tS occurs within the window W, or represents the end instant td2' of the window W if the synchronizing instant tS occurs outside the window W. A first time period generating circuit Tc1 is identical to the time period generating circuit Tc as shown in FIG. 1. The first time period generating circuit Tc1 receives the reference instant tR as the start instant ti, a first reference value Ref1 as the reference value Ref, and a first predetermined number Np1 as the predetermined number N, and supplies a first time period instant td1 as the time period instant td. A second time period generating circuit Tc2 receives the first time period instant td1, two reference values Ref2, Ref2', and a second predetermined number Np2, and supplies the window signal Ws. The second time period generating circuit Tc2 comprises a part which is identical to the time period generating circuit Tc shown in FIG. 1. This part receives the first time period instant td1 as the start instant ti, one of the reference values Ref2, Ref2' as the reference value Ref, the second predetermined number Np2 as the predetermined number N, and the reference instant tR as the integrator reset ir, and supplies a leading edge of the window W at the start window instant td2 as the time period instant td. The second time period generating circuit Tc2 further comprises a second comparator 7 and a logic circuit 8. During the third sub-period T3,2 of the sawtooth voltage ios2 of the second time period generating circuit Tc2, the second comparator 7 compares the sawtooth voltage ios2 with the other one of the reference values Ref2, Ref2' to obtain a trailing edge of the window W at a window end instant td2'. The logic circuit 8 combines the trailing and the leading edge of the window W into the window signal Ws. So, the window signal Ws is generated with respect to the instant of occurrence of a preceding reference instant tR contained in the reference signal R. The synchronisation instant tS occurs within the window W if it occurs between the start instant td2, which is the leading edge of the window W, and the end instant td2', which is the trailing edge of the window W.

The synchronisation circuit directly synchronizes the reference signal R with the synchronizing signal S. Such a synchronizing circuit is especially suitable for frame synchronisation, or for line synchronisation of stable line synchronizing signals S as supplied by computers. A third time period generating circuit Tc3 is identical to the time period generating circuit Tc as shown in FIG. 1. The third time period generating circuit Tc3 receives the first time period instant td1 as the start instant ti, a third reference value Ref3 as the reference value Ref, and a third predetermined number Np3 as the predetermined number N, and supplies a third time period instant td3 as the time period instant td.

FIG. 5 further shows a duration measurement circuit 14 and a number adapting counting circuit 15. The duration measurement circuit 14 receives the synchronisation signal S to supply a synchronisation period signal Sp to the number adapting counting circuit 15. The synchronisation period signal Sp is a measure of the time interval between two successive synchronising instants tS. The number adapting counting circuit 15 controls the numbers Np1,Np2,Np3 of clock pulses Clk to be counted for adapting a duration of the sub time period T2,1, T2,2, and T2,3 in response to the measured time interval between the two successive synchronising instants tS. The sub-time periods T2,1, T2,2, and T2,3, are the digital counting periods which interrupt the analog integration operations.

Figure 6:
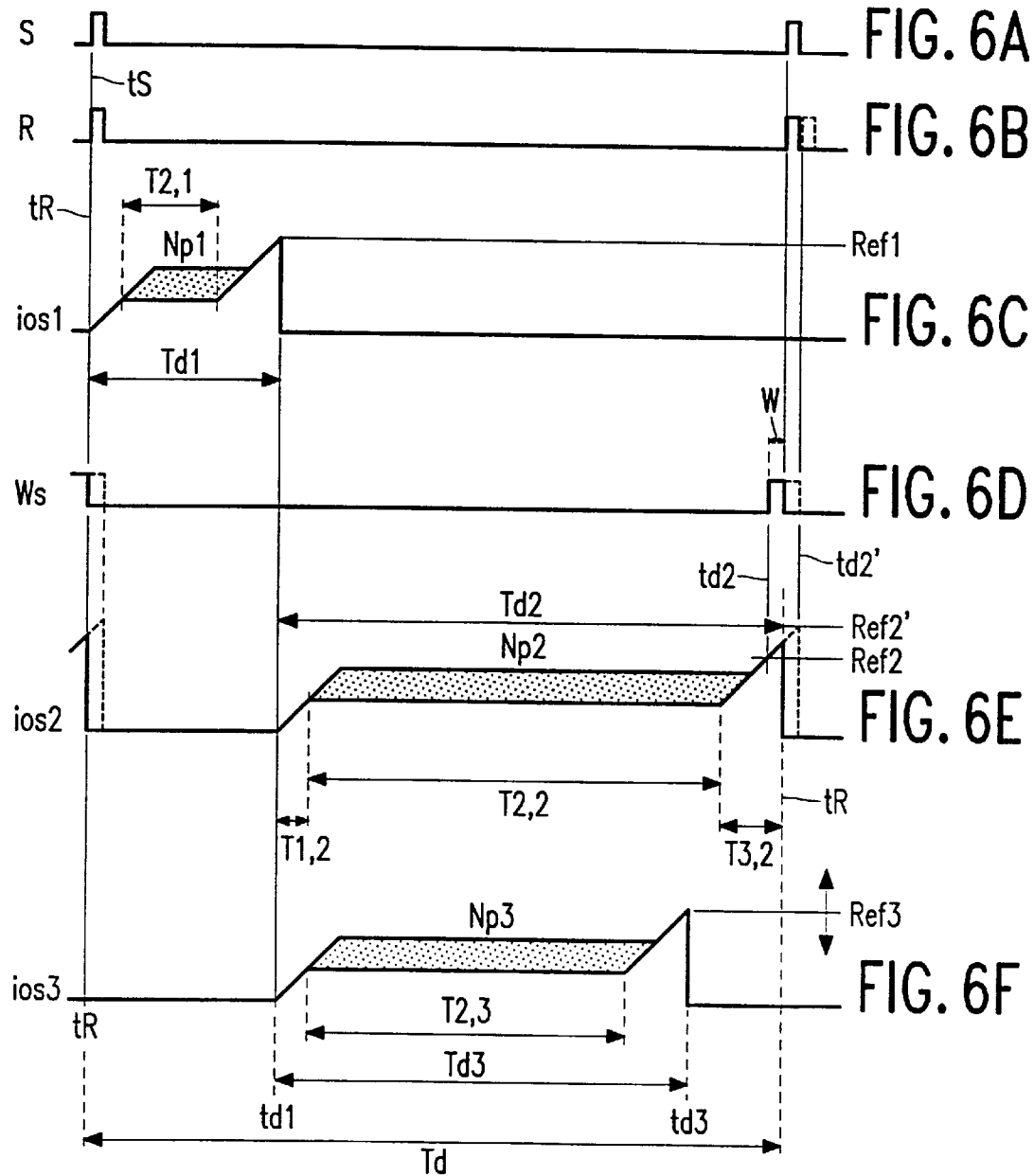
FIGS. 6A to 6F show waveforms for explaining the operation of the circuit diagram of FIG. 5.

FIGS. 6A to 6F show waveforms for explaining the operation of the circuit diagram of FIG. 5 in the case of a line synchronizing circuit. FIG. 6A shows the synchronizing pulses S. The synchronizing instants tS are represented by the rising edges of the synchronizing pulses S. FIG. 6B shows the reference signal R, the reference instants tR are represented by the rising edges of pulses. FIG. 6C shows a first integrator output signal or sawtooth voltage ios1 for elucidating the generation of the first time period instant td1. FIG. 6D shows the window signal Ws. FIG. 6E shows a second integrator output signal or sawtooth voltage ios2 for elucidating the generation of the window W. FIG. 6F shows a third integrator output signal or sawtooth voltage ios3.

Large phase jumps of the reference instant tR are avoided by the use of the window W. The incoming line synchronizing instant tS is only accepted if it occurs during the window W. The window signal Ws is generated by the line synchronizing circuit in the following way. A line synchronizing instant tS which occurs within the window W is directly used as the reference instant tR. The first time period generating circuit Tc1 generates a fixed first delay or time period Td1 which starts at the reference instant tR and ends at the first time period instant td1. A second time period generating circuit Tc2 generates the window signal Ws starting from the first time period instant td1. The third time period generating circuit Tc3 generates a third time period Td3 starting from the first time period instant td1 for obtaining a phase reference instant td3. The phase reference instant td3 is supplied to a line deflection output stage and determines the line position of the information displayed on the display screen. Although the first delay Td1 is not essential to the synchronisation circuit it has two advantages. First, the first delay Td1 allows the phase reference instant td3 to occur after the reference instant tR and thus after the line synchronizing instant tS. A line shift of the displayed information can now controllably occur also after the reference instant tR. The second advantage is that the second sawtooth voltage ios2 is allowed some time be fore it is accurately reset to its starting level. If a line shift is not required, the third time period generating circuit Tc3 can be omitted.

After the first delay Td1, the second integrator output signal ios2 is started. The window signal Ws becomes active at the start window instant td2 at which the second integrator output signal ios2 crosses the second reference level Ref2. If no synchronizing instant tS occurs, the window signal Ws becomes inactive at the end window instant td2' at which the second integrator output signal ios2 crosses a further reference level Ref2'. If a synchronizing instant tS occurs before the second integrator output signal ios2 crosses the further reference level Ref2', the window signal Ws becomes inactive the instant the synchronizing instant tS occurs. So, a window W is generated, starting at the start window instant td2, and ending at the synchronising instant tS or the end window instant td2'. The reference instant tR coincides with the instant the window signal Ws becomes inactive. The second time period Td2 starts at the first time period instant td1 and ends at the synchronising instant tS or the window end instant td2'.

Figure 7:
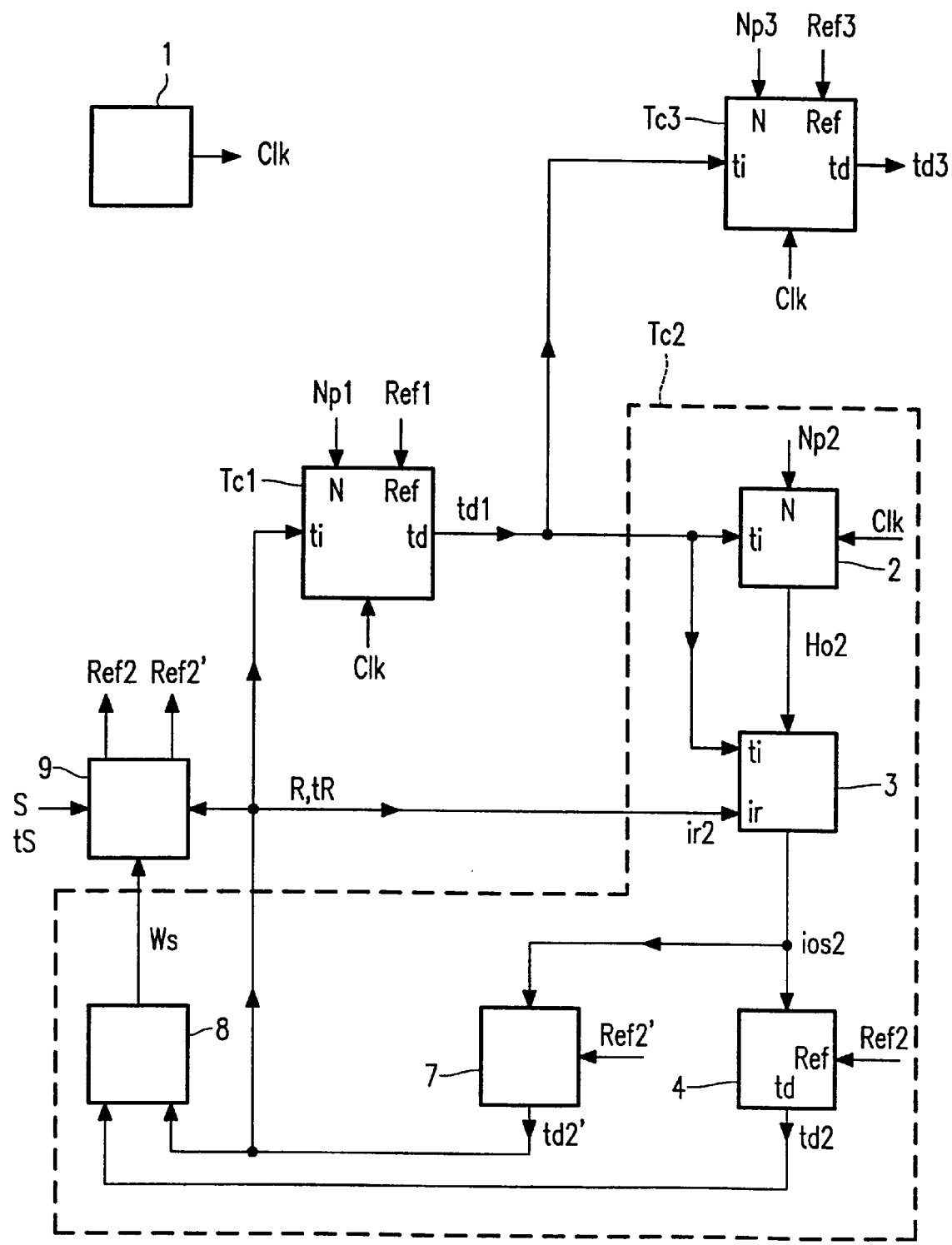
FIG. 7 shows a circuit diagram of another embodiment of a synchronizing circuit with a circuit for generating a time period according to the invention.

FIG. 7 shows a circuit diagram of a synchronizing circuit for synchronizing reference instants tR with synchronizing instants tS. The synchronizing circuit comprises a first, a second, and a third time period generating circuit Tc1, Tc2 and Tc3, each which are equivalent to the time period generating circuit Tc according to the invention.

The first time period generating circuit Tc1 is identical to the time period generating circuit Tc shown in FIG. 1. The first time period generating circuit Tc1 receives a reference instant tR as the start instant ti, a first reference value Ref1 as the reference value Ref, and a first predetermined number Np1 as the predetermined number N, and supplies a first time period instant td1 as the time period instant td.

The second time period generating circuit Tc2 receives the first time period instant td1, two reference values Ref2, Ref2', and a second predetermined number Np2, and supplies a window signal Ws. The second time period generating circuit Tc2 comprises a part which is identical to the time period generating circuit Tc shown in FIG. 1. This part receives the first time period instant td1 as the start instant ti, one of the reference values Ref2, Ref2' as the reference value Ref, the second predetermined number Np2 as the predetermined number N, and the reference instant tR as the integrator reset ir, and supplies a leading edge of the window W at an instant td2 as the time period instant td. The second time period generating circuit Tc2 further comprises a second comparator 7 and a logic circuit 8. The second comparator 7 compares the sawtooth voltage ios2 with the other one of the reference values Ref2, Ref2' to obtain a trailing edge of the window W at an instant td2'. The reference instant tR coincidences with the instant td2'. The logic circuit 8 combines the trailing and leading edges of the window W into the window signal Ws. So, the window signal Ws is generated with respect to the instant of occurrence of a preceding reference instant tR contained in the reference signal R.

A phase comparator circuit 9 receives the synchronizing signal S, the reference signal R, and the window signal Ws. The phase comparator circuit 9 controls the two reference levels Ref2, Ref2' in response to a phase difference φ between the synchronizing instant tS and the reference instant tR to decrease this phase difference φ in a next synchronizing period Ts. The phase difference φ is limited to the phase difference between the leading and the trailing edge of the window signal Ws if the synchronising instant tS does not occur within the window W. This limitation of the phase difference is not essential to the invention, the window W may thus be omitted.

A third time period generating circuit Tc3 is identical to the time period generating circuit Tc shown in FIG. 1. The third time period generating circuit Tc3 receives the first time period instant td1 as the start instant ti, a third reference value Ref3 as the reference value Ref, and a third predetermined number Np3 as the predetermined number N, and supplies a phase reference instant td3 as the time period instant td. The phase reference instant td3 is supplied to a deflection output stage and enables a shift of the position of the information displayed on the display screen. The amount of shift depends on the third predetermined number Np3 and the third reference value Ref3. Also this shift is optional, so, the first and third time period generating circuits Tc1, Tc3 are not essential to the invention.

Such a synchronizing circuit is especially suitable for line synchronisation of unstable line synchronizing signals S as received from television broadcasting or VCR players.

Figure 8:
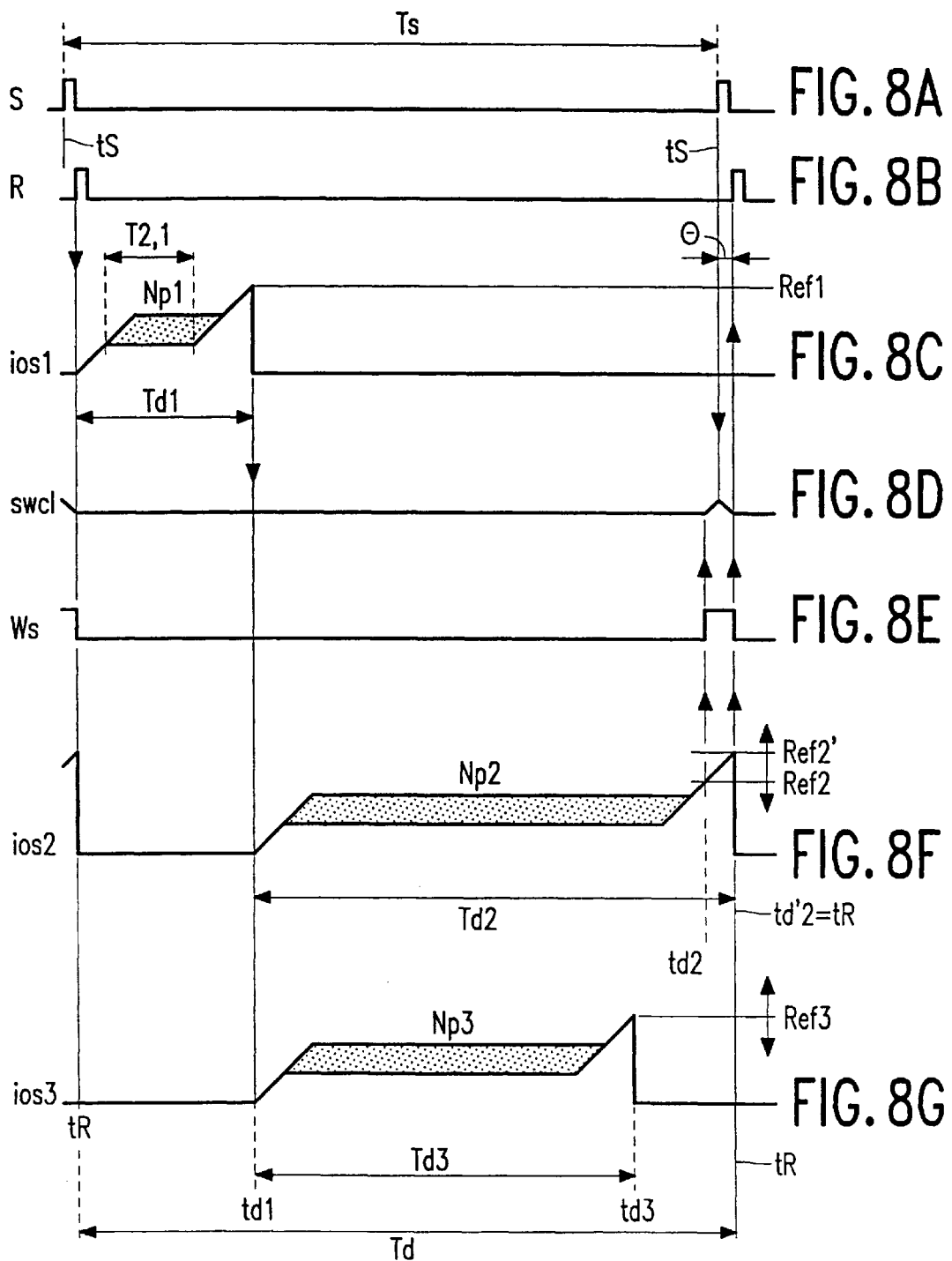
FIGS. 8A to 8G show waveforms for explaining the operation of the circuit diagram of FIG. 7.

FIGS. 8A to 8G show waveforms for explaining the operation of the circuit diagram of FIG. 7. FIG. 8A shows the synchronizing signal S. FIG. 8B shows the reference signal R. FIG. 8C shows a first integrator output signal or sawtooth voltage iosl for elucidating the generation of the first time period instant td1. FIG. 8D shows a phase discriminator level swcl indicative of the reference levels Ref2 and Ref2'. FIG. 8E shows the window signal Ws. FIG. 8F shows a second integrator output signal or sawtooth voltage ios2 for elucidating the generation of the window W. FIG. 8G shows a third integrator output signal or sawtooth voltage ios3 for elucidating the generation of the phase reference instant td3.

The generation of the first, second, and third sawtooth voltage iosl, ios2, ios3 is already described in detail with respect to FIGS. 6A to 6F.

The reference instants tR are generated by low pass filtering the synchronizing instants tS by the phase comparator circuit 9. The phase comparator circuit 9 generates the phase discriminator level swcl which is a measure of the phase difference between a reference instant tR and a corresponding synchronizing instant tS. The phase comparator circuit 9 may be of any known construction. The phase comparator circuit 9 used in the synchronizing circuit according to FIG. 7 generates the phase discriminator level swcl by starting integrating in a first direction at the start instant td2 of the window W until the synchronization instant tS occurs. After the synchronisation instant tS, the phase comparator circuit 9 starts integrating in a direction opposite to the first direction until the instant td2' at which the end of the window W occurs. The start and end instants of the window are controlled by the reference levels Ref2 and Ref2', respectively. The reference levels Ref2 and Ref2' are controlled with the phase discriminator level swcl such that the synchronizing instant tS occurs at the centre of the window pulse Ws (in a stable situation wherein a repetition frequency of the synchronizing instants tS is constant). If the synchronizing instant tS occurs after the centre of the window W, the integration in the first direction occurs during a longer time than the integration in the opposite direction. Consequently, the phase discriminator level swcl increases, thereby increasing a value of the reference levels Ref2 and Ref2'. The second sawtooth signal ios2 reaches the reference level Ref2' at a later instant, and thus the instant td2' occurs later. The end of the window W and the reference instant tR both coincide with the instant td2', and thus also occur later.

In case of missing synchronizing instants tS the synchronisation circuits of FIGS. 5 and 7 enter a free running state wherein the repetition frequency of the reference instants tR is determined substantially by the sum of the predetermined numbers Np1 and Np2. The free running frequency remains nearly unchanged, as will be explained below. In the synchronisation circuit as shown in FIG. 5, the total delay Td (the time between two consecutive reference instants tR) increases until the sawtooth voltage ios2 crosses the reference level Ref2' (the window closing level), thereby slightly reducing the free running frequency. In the synchronisation circuit as shown in FIG. 7, the total delay time Td increases or decreases, depending on the sign of the leakage of the phase detector 9. In both cases the change in delay time does not exceed the duration of the third sub-period T3, which in a practical realisation is less than 3 clock pulse periods T. In case of missing synchronisation instants tS, the predetermined numbers Np1, Np2 and Np3 are frozen and the free running frequency remains almost unchanged until the synchronisation instants tS reappear.

The free running frequency can be adapted automatically to cope with synchronisation instants tS which fall outside the window W. The repetition frequency of the synchronizing instants tS may be measured by counting the number of clock pulses Clk between two consecutive synchronizing instants tS with a counter 14. All predetermined numbers Np1, Np2, and Np3 (determining the digitally generated delays) can be incremented or decremented (15) in response to the counted number of clock pulses Clk. It is possible to adapt (15) the predetermined numbers Np1, Np2, and Np3 in one step or in a series of small steps. The small increment or decrement determines the adaption speed. If the repetition frequency of the synchronisation instants tS changes, the predetermined numbers Np1, Np2, and Np3 have to be adapted (15) to new values which are used until a next frequency change is detected. If the repetition frequency of the synchronisation instants tS is constant but a phase jump occurs, the predetermined numbers Np1, Np2, and Np3 have to be adapted (15) to new values only for a short time. During this short time, the phase jump is compensated and thereafter the old predetermined numbers Np1, Np2, and Np3 should be used again. A detection circuit 14 can easily determine whether a frequency or phase step occurs by comparing the duration of consecutive synchronisation periods Ts.

It has been stated hereinabove that the analog part of the delays Td1, Td2, Td3 can be controlled by controlling the reference level Ref1, Ref2, Ref3 while keeping the slope of the sawtooth voltage ios1, ios2, ios3 constant. In another way of controlling the analog part of the delays Td1, Td2, Td3, the slope of the sawtooth voltage ios is varied while the phase reference level Ref is kept constant. The phase reference instant td3 determines the position of the information displayed on the display screen, and thus needs to be controllable with analog precision. Changing the reference level Ref3 requires an additional digital to analog converter. Such a digital to analog converter is complex. The slope of the sawtooth voltage ios3 may be obtained by charging or discharging a reference capacitor with a current. The slope depends on the amount of current and a value of the reference capacitor. The slope may be changed by adding capacitors in parallel to the reference sawtooth capacitor. If these additional capacitors are binary weighted, a perfect match between the digitally counted delay and the analog delay is obtained. The analog delay is adjustable in discrete steps corresponding to the actually parallel arranged capacitors. The reference level Ref3 may be chosen so as to be equal to the reference level Ref1. A good accuracy of the discrete steps is reached if both the sawtooth voltages ios1 and ios3 are generated by matched sawtooth generators which are calibrated.

Figure 9:
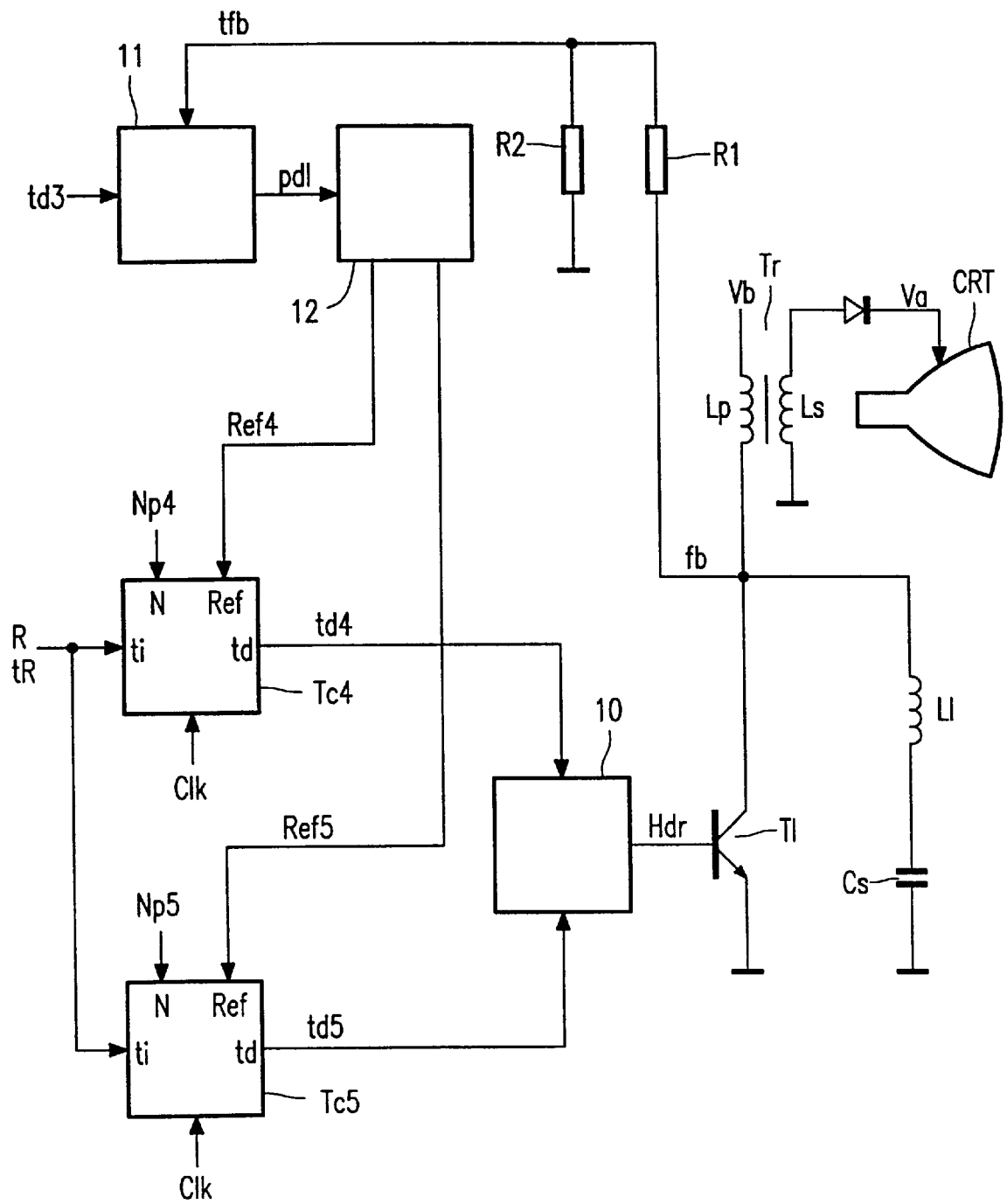
FIG. 9 shows a circuit diagram of a display apparatus comprising a line deflection circuit with a synchronizing circuit which comprises a circuit for generating a time period according to the invention.

FIG. 9 shows a circuit diagram of a display apparatus comprising a line deflection circuit with a synchronizing circuit for synchronising a line flyback pulse fb with a reference instant td3. The operation of the line deflection circuit of FIG. 9 is elucidated with respect to FIGS. 10A to 10G.

The synchronizing circuit comprises a fourth and a fifth time period generating circuit Tc4 and Tc5 which each are equivalent to the time period generating circuit Tc according to the invention. Such a synchronisation circuit is known as a phi two loop. Instead of the line flyback pulse fb, any signal representing the line position of the display information on the display screen can be used. The reference instant td3 may be the phase reference instant td3 supplied by the third time generating circuit Tc3 as described with respect to FIG. 5.

The fourth time period generating circuit Tc4 is identical to the time period generating circuit Tc as shown in FIG. 1. The fourth time period generating circuit Tc4 receives the reference instant tR as the start instant ti, a fourth reference value Ref4 as the reference value Ref, and a fourth predetermined number Np4 as the predetermined number N, and supplies a fourth time period instant td4 as the time period instant td.

The fifth time period generating circuit Tc5 receives the reference instant tR as the start instant ti, a fifth reference value Ref5 as the reference value Ref, and a fifth predetermined number Np5 as the predetermined number N, and supplies a fifth time period instant td5 as the time period instant td. The reference instant tR may be generated by the circuit of FIG. 5.

A drive circuit 10 receives the fourth and the fifth time period instants td4, td5 to generate a line drive signal Hdr which is supplied to a line output transistor T1 in a line deflection circuit for periodically switching on and off the line output transistor T1. The fourth time period instant td4 determines the switch-on instant of the line output transistor T1. The fifth time period instant td5 determines the switch-off instant tfb of the line output transistor T1. Due to charge storage in the line output transistor T1, it takes a so called storage time Tst before the line output transistor T1 is actually switched off after the switch-off command is applied at the fifth time period instant td5. At the moment tfb the line output transistor T1 is actually switched off, the flyback pulse fb starts. The storage time Tst depends, for example, on the current through the line output transistor T1 and the temperature. The current through the line output transistor T1 depends on the anode current of the cathode ray tube and thus on the information displayed on the screen of the cathode ray tube.

The phase of the line drive pulse Hdr is controlled such that the flyback start instant tfb of the flyback pulse fb coincides with the phase reference instant td3. The phase of the line drive pulse Hdr is controlled by adapting the fourth and the fifth reference value Ref4, Ref5 in response to a phase difference between the phase reference instant td3 and the flyback start instant tfb. For this reason, the synchronizing circuit further comprises a phase discriminator circuit 11 and a level adapting circuit 12. The phase discriminator circuit 11 receives the phase reference instant td3 and the flyback start instance tfb, and supplies a phase difference signal pd1 to the level adapting circuit 12. The phase difference signal pd1 depends on the phase difference between the phase reference instant td3 and the flyback start instant tfb. The phase discriminator 11 may be of any type. The level adapting circuit 12 adapts the fifth reference level Ref5, or both the fourth and the fifth reference level Ref4, Ref5, in response to the phase difference signal pd1. If, for example, the flyback start instant tfb occurs later than the phase reference instant td3, the fifth reference level Ref5 is decreased. Consequently, a next flyback start instant tfb occurs a shorter time period Td5 after a next reference moment tR. It is possible to select the fourth reference level Ref4 to be equal to the fifth reference level Ref5.

The line deflection circuit further comprises a line output circuit with a transformer Tr with a primary winding Lp, arranged between a supply voltage Vb and a collector of the line output transistor T1, and a secondary winding Ls for supplying an anode voltage Va to an anode of the cathode ray tube CRT. The line output transistor T1 has an emitter connected to ground and a base receiving the line drive pulse Hdr. A series arrangement of a line deflection coil L1 and an S-correction capacitor Cs is arranged between the collector and the emitter of the line output transistor T1. A resistor tap R1, R2 supplies a tapped flyback pulse tfb to the phase discriminator 11. The line output circuit is simplified for elucidation of the invention. Many alternative line output circuits may be used. For example, the line output transformer Tr may be a choke, the line output transistor T1 may be a Mos transistor, and a diode modulator circuit may be added.

FIGS. 10A to 10G show waveforms for explaining the operation of the circuit diagram of FIG. 9. FIG. 10A shows the reference signal R. FIG. 10B shows the first sawtooth voltage ios1. FIG. 10C shows the second sawtooth voltage ios2. FIG. 10D shows a fourth integrator output signal or sawtooth voltage ios4 for elucidating the generation of the phase reference instant td4. FIG. 10E shows a fifth integrator output signal or sawtooth voltage ios5 for elucidating the generation of the phase reference instant tdS. FIG. 10F shows the line drive pulse Hdr. FIG. 10G shows the flyback pulse fb.

FIGS. 10A to 10C are identical to FIGS. 8B, 8C, and 8G, respectively. Their relation is explained in the description of FIGS. 8A to 8G.

The start instant td4 of the line drive pulse Hdr is generated when the fourth sawtooth voltage ios4 crosses the fourth reference level Ref4. The end instant td5 of the line drive pulse Hdr is generated when the fifth sawtooth voltage ios5 crosses the fifth reference level Ref5. The switch-on time Ton of the line drive pulse Hdr is mainly determined by the difference between the fourth and fifth predetermined values Np4 and Np5.

Variations in the storage time Tst of the line output transistor due to temperature or load variations cause a shift in the line deflection position of the information displayed on the cathode ray tube screen. This shift is determined by the phase detector 11 by measuring the phase between the phase reference instant td3 and the start instant tfb of the line flyback pulse fb. It is also possible to use the center instant of the line flyback pulse fb instead of the start instant tfb. The shift is counteracted by controlling the fourth and fifth reference levels Ref4, Ref5 in response to the detected phase difference.

Large variations in the storage time Tst cause the fourth and the fifth reference level Ref4, Ref5 to be shifted to a value outside the limits of the linear control as determined by the selected slope of the fourth and the fifth sawtooth voltage ios4, ios5. This should be compensated for by a change of both the fourth and the fifth predetermined values Np4, Np5. Whether such a change is needed can be detected by monitoring the value of the sawtooth voltage ios4 or ios5, or by monitoring the phase difference with the phase detector 11. If the sawtooth voltage ios4 or ios5 rises above or falls below a certain level, or if the phase detector 11 detects that the phase difference between the phase reference instant td3 and the start instant tfb becomes smaller or larger than a predetermined value, the fourth and the fifth predetermined values Np4, Np5 are adapted accordingly. However, such a change results in a phase jump of one clock pulse Clk if no counter-measures are taken. A decrease of both the fourth and the fifth predetermined values Np4, Np5 with a simultaneous increase of the fourth and fifth reference levels Ref4, Ref5 is required if the fourth and fifth reference levels Ref4, Ref5 are too low. The required change in the fourth and fifth reference levels Ref4, Ref5 can easily be obtained if the sawtooth generators are matched. The sawtooth capacitors can be matched because of their value. For a sawtooth jitter of 30 pico-seconds a capacitor value of about 10 pf is needed. The sawtooth slope is calibrated with respect to the clock.

It is easy to incorporate a switch-off and soft start of the line deflection in the phi2 loop which comprises time period generating circuits Tc according to the invention. The line deflection is switched off when both the fourth and fifth predetermined number Np4, Np5 are set to equal values. Soft start of the line deflection is possible by setting first both the fourth and fifth predetermined number Np4, Np5 to zero, and then increasing Np5. When the required switch-on time Ton is reached, both Np4 and Np5 are increased until the fourth and fifth reference levels Ref4, Ref5 are in their linear range. For a soft stop, the soft start procedure is reversed.

While the invention has been described in connection with preferred embodiments, it will be understood that modifications thereof within the principles outlined above will be evident to those skilled in the art, and thus the invention is not limited to the preferred embodiments, but is intended to encompass such modifications.

The generation of a time period Td according to the invention can be used advantageously for generating a time window W or synchronizing a reference instant tR with a synchronizing instant tS.

A time window W may be generated with respect to a start instant ti by generating a time period Td as claimed in claim 1. The integration value ios during the third sub-period T3 is compared with two different reference levels Ref2, Ref2'. One of the reference levels Ref2 determines the start of the time window W, the other reference level Ref2' determines the end of the time window W, as described with respect to FIG. 6. A time window W may also be generated with respect to a start instant ti by generating a first time period as claimed in claim 1. During the second sub-period T2 of the first time period a first predetermined number of clock pulses Clk is counted. A second time period as claimed in claim 1 is generated with a second sub-period T2 determined by counting a second predetermined number of clock pulses Clk. The second time period may be started at the same instant as the first time period or at the end of the first time period.

Below, brief descriptions of three basic ways of synchronizing are listed. Each of the basic ways of synchronizing uses one or more time periods Td generated according to the invention.

In a first synchronisation method, which is called direct synchronisation, a time window W is generated as discussed above. The start instant td2 of a present time window W is the reference instant tR generated during a preceding synchronisation period Ts. The reference instant tR in the present synchronisation period Ts is the synchronisation instant tS if the synchronisation instant tS occurs within the time window W; the reference instant tR in the present synchronisation period Ts is the end instant td2' of the window W if the synchronisation instant tS occurs outside the time window W. Such a synchronisation method, which is described, with respect to FIG. 6, in a more comprehensive embodiment, is especially suitable for frame synchronisation or line synchronisation in computer monitors.

In a second synchronisation method, which is called flywheel synchronisation, a time period Td is generated as described with respect to claim 1. The start instant ti of the time period Td in a present synchronisation period Ts is the reference instant tR generated during a preceding synchronisation period Ts. The reference level Ref is controlled in response to the phase difference between the synchronisation instant tS and the reference instant tR in a same preceding synchronisation period Ts. The reference level Ref defines the end instant of the time period Td. This end instant of the time period Td is the reference instant tR. The second synchronisation method is especially suitable for the phi-one synchronisation phase loop in TV apparatuses which synchronizes an internal reference instant tR with an incoming synchronizing instant tS via a flywheel mechanism. A more comprehensive embodiment of the second synchronisation method is described with respect to FIG. 7.

In a third synchronisation method, which is called phi-two loop, a reference instant tfb is synchronised with a synchronising instant as described in the first or the second synchronisation method (the phi-one loop). The synchronisation instant is an instant having a delay with respect to the reference instant tR as generated by the first or the second synchronizing method. The reference instant tfb of the third synchronizing method is an instant related to the start of the line flyback pulse fb. In this way, a varying switch-off delay Tst of a line output transistor T1 is compensated. A more comprehensive embodiment of the third synchronisation method is described with respect to FIG. 9.

It is possible to adjust the number of clock pulses Clk counted during the second sub-period T2 automatically in response to the repetition frequency of the synchronisation instants tS. In this way, the method of synchronizing is suitable for different repetition frequencies of synchronisation instants, without the need for complex circuits. The number of clock pulses Clk to be counted may be adapted to obtain a substantially constant period during which the analog integration operation is active, independent of the duration between the two successive synchronising instants tS. In this way, the reference level Ref is kept near to a center value, thus enabling a maximum control range independent of this repetition frequency.

The generation of a highly accurate time period according to the invetnion can also be used to determine the on and/or off time periods of a main switching element in a switched mode power supply. For example, in a switched modw power supply which supplies the anode voltage Va, the on time of the main switching element is controlled by a feedback voltage to stabilize the anode voltage Va.

Any reference signs in the following claims should not be construed as limiting the claims.

What is claimed is:

1. A method of generating a time period (Td) having a start instant (ti) and an end instant (td), the method comprising the steps of:

analog integration to obtain an integration value (ios) by generating a current (I) for obtaining a sawtooth voltage (ios) across a capacitor wherein the sawtooth voltage (ios) represents the integration value (ios), the analog integration starting at the start instant (ti), comparing the integration value (ios) with a reference value (Ref) to determine a crossing instant (td) at which the integration value (ios) crosses the reference value (Ref), generating clock pulses (Clk), counting clock pulses (Clk) for determining a sub-time period (T2), temporarily interrupting the step of analog integration during the step of counting the clock pulses (Clk), an integration value (ios) at the end of the sub-time period (T2) being equal to an integration value (ios) at the start of the sub-time period (T2), and the crossing instant (td) being the end instant (td) of the time period (Td), wherein the method further comprises;

generating a calibration time period (Tcal) by counting a predetermined number of clock pulses (Clk), starting the step of analog integration at the start of the calibration time period (Tcal), measuring the sawtooth voltage (ios) on the capacitor at an end of the calibration time period (Tcal) to obtain a measured voltage, comparing the measured voltage with a desired value (dv), and adjusting the step of analog integration by adapting the current (I) or a value of the capacitor in response to a difference between the measured voltage and the desired value (dv).

2. A circuit for synchronizing reference instants (tR) to synchronizing instants (tS) by generating a time period (Td) having a start instant (ti) and an end instant (td), which circuit comprises:

means for analog integration to obtain an integration value (ios), the analog integration starting at the start instant (ti), means for comparing the integration value (ios) with a reference value (Ref) to determine a crossing instant (td) at which the integration value (ios) crosses the reference value (Ref), means for generating clock pulses (Clk), means for counting clock pulses (Clk) to determine a sub-time period (T2), means for temporarily interrupting the analog integration during the counting of the clock pulses (Clk), an integration value (ios) at the end of the sub-time period (T2) being equal to an integration value (ios) at the start of the sub-time period (T2), and the crossing instant (td) being the end instant (td) of the time period (Td), and further comprising;

means for measuring a repetition frequency of the synchronizing instants (tS), and means for adapting a number of clock pulses (Clk) occurring during the sub-time period (T2) in accordance with the repetition frequency.

3. A display apparatus with a synchronization circuit or a switched mode power supply comprising a circuit for synchronizing reference instants (tR) to synchronizing instants (tS) by generating a time period (Td) having a start instant (ti) and an end instant (td), which circuit comprises:

means for analog integration to obtain an integration value (ios), the analog integration starting at the start instant (ti), means for comparing the integration value (ios) with a reference value (Ref) to determine a crossing instant (td) at which the integration value (ios) crosses the reference value (Ref), means for generating clock pulses (Clk), means for counting clock pulses (Clk) to determine a sub-time period (T2), means for temporarily interrupting the analog integration during the counting of the clock pulses (Clk), an integration value (ios) at the end of the sub-time period (T2) being equal to an integration value (ios) at the start of the sub-time period (T2), and the crossing instant (td) being the end instant (td) of the time period (Td), and further comprising;

means for measuring a repetition frequency of the synchronizing instants (tS), and means for adapting a number of clock pulses (Clk) occurring during the sub-time period (T2) in accordance with the repetition frequency.

4. A synchronization method for synchronizing reference instants (tR) to synchronizing instants (tS), the synchronizing method comprising the step of generating a time period (Td) having a start instant (ti) and an end instant (td), wherein the step of generating the time period (Td) comprises the steps of:

analog integrating to obtain an integration value (ios), the analog integrating starting at the start instant (ti), comparing the integration value (ios) with a reference value (Ref) to determine a crossing instant (td) at which the integration value (ios) crosses the reference value (Ref), generating clock pulses (Clk), counting clock pulses (Clk) for determining a sub-time period (T2), temporarily interrupting the step of analog integrating during the step of counting the clock pulses (Clk), an integration value (ios) at the end of the sub-time period (T2) being equal to an integration value (ios) at the start of the sub-time period (T2), and the crossing instant (td) being the end instant (td) of the time period (Td), measuring a repetition frequency of the synchronizing instants (tS), and adapting a number of clock pulses (Clk) occurring during the sub-time period (T2) in accordance with the repetition frequency.

5. A synchronization method as claimed in claim 4 wherein the step of measuring comprises the step of detecting whether the repetition frequency is constant but a phase jump occurs to control the step of adapting for temporarily adapting the number of clock pulses (Clk) occurring during the sub-time period (T2).

* * * * *